United States Patent
Shiimoto et al.

(10) Patent No.: US 8,102,716 B2
(45) Date of Patent: Jan. 24, 2012

(54) NONVOLATILE SEMICONDUCTOR MEMORY DEVICE AND METHOD FOR PERFORMING VERIFY WRITE OPERATION ON THE SAME

(75) Inventors: Tsunenori Shiimoto, Kanagawa (JP);
Makoto Kitagawa, Kanagawa (JP);
Tomohito Tsushima, Tokyo (JP)

(73) Assignee: Sony Corporation, Tokyo (JP)

( * ) Notice: Subject to any disclaimer, the term of this patent is extended or adjusted under 35 U.S.C. 154(b) by 217 days.

(21) Appl. No.: 12/654,783

(22) Filed: Jan. 4, 2010

(65) Prior Publication Data

US 2010/0195370 A1    Aug. 5, 2010

(30) Foreign Application Priority Data

Feb. 5, 2009   (JP) .................................. 2009-024724

(51) Int. Cl.
*G11C 11/34* (2006.01)
(52) U.S. Cl. ............................ 365/185.22; 365/189.011
(58) Field of Classification Search ............. 365/185.22, 365/189.011
See application file for complete search history.

(56) References Cited

U.S. PATENT DOCUMENTS 5,297,095 A * 3/1994 Sato et al. ................ 365/185.22

FOREIGN PATENT DOCUMENTS

| JP | 08-018018 A | 1/1996 |
|---|---|---|
| JP | 11-176179 A | 7/1999 |
| JP | 2002-133899 A | 5/2002 |
| JP | 2002-279789 A | 9/2002 |
| JP | 2004-234707 A | 8/2004 |
| JP | 2005-235360 | 9/2005 |
| JP | 2007-242191 | 9/2007 |
| JP | 2010-113742 A | 5/2010 |

OTHER PUBLICATIONS

Japanese Office Action issued Nov. 9, 2010 for corresponding Japanese Application No. 2009-024724.

* cited by examiner

*Primary Examiner* — Son Dinh
*Assistant Examiner* — Nam Nguyen
(74) *Attorney, Agent, or Firm* — Rader, Fishman & Grauer PLLC

(57) ABSTRACT

Disclosed herein is a nonvolatile semiconductor memory device including a plurality of memory cells; and a driver circuit configured to perform a verify write operation in a cycle including selecting from an array of the plurality of memory cells a predetermined number of memory cells constituting a write cell unit, writing data collectively to the predetermined number of memory cells, and verifying the written data, the driver circuit further performing the verify write operation repeatedly until all memory cells within the write cell unit are found to have passed the verification.

10 Claims, 7 Drawing Sheets

NONVOLATILE SEMICONDUCTOR MEMORY DEVICE AND METHOD FOR PERFORMING VERIFY WRITE OPERATION ON THE SAME

BACKGROUND OF THE INVENTION

1. Field of the Invention

The present invention relates to a nonvolatile semiconductor memory device in which a plurality of memory cells are arrayed in specific fashion, and a method for performing a verify write operation on that device.

2. Description of the Related Art

There exist methods (such as one disclosed in Japanese Patent Laid-open No. 2007-242191; called Patent Document 1 hereunder) for raising the number of bits to be programmed simultaneously in order to increase the speed at which to write illustratively to NOR type nonvolatile semiconductor memory (flash memory) devices. The methods of this kind are aimed at achieving enhanced write speeds by simultaneously verify-read numerous bits in a program verify read operation.

Such techniques for faster programming are not limited to the existing nonvolatile memory devices; they may also be applied extensively to other types of nonvolatile memory devices including resistance-variable type memory devices disclosed in Japanese Patent Laid-open No. 2005-235360 (called Patent Document 2 hereunder).

Illustratively for NOR type flash memories, the write speed is typically about 100 μsec. per bit and the write current is about 100 μA as discussed in Patent Document 1 as part of the related art. When data is written 8 to 32 bits at a time upon programming, a program throughput of 8 to 32 bits/10 μsec. (=100 kilobytes/sec. to 400 kilobytes/sec.) is attained. The write current necessary for the operation is approximately 800 μA to 3.2 mA.

The above-cited Patent Document 1 proposes arrangements for securing the current paths on which a voltage drop over wiring is limited when a large current is supplied to deal with growing numbers of bits to be programmed simultaneously. These arrangements are designed to boost program throughput.

SUMMARY OF THE INVENTION

Because increasing the number of bits to be simultaneously verified entails feeding larger write currents, it is important to secure suitable current paths. Generally, however, it is more important to ease restrictions on the power source than to secure the current path. That is, to incorporate compactly a power source supplying a large current in the chip desires generating that current using an internally boosted supply voltage. The very act of supplying the large current in the chip, however, is difficult to accomplish.

Thus what is more important in establishing the techniques for practically enhancing program throughput is to reconcile the reduction of write time with the drop in maximum write current.

This applies also to flash memories of other than the NOR type and to other nonvolatile memories discussed in Patent Document 2.

According to the currently known programming methods, as outlined above, program throughput has been boosted but no consideration has been made for the constraints on write current. In that sense, the existing methods may not be considered practical.

The embodiments of the present invention have been made in view of the above circumstances and provide a nonvolatile semiconductor memory device having driver circuits for boosting program throughput while attempting to reduce write current. The embodiments of the present invention further provide a method for performing verify write operations on that nonvolatile semiconductor memory device for boosting program throughput while attempting to reduce write current.

In carrying out the present invention and according to one embodiment thereof, there is provided a nonvolatile semiconductor memory device including: a plurality of memory cells; and a driver circuit configured to perform a verify write operation in a cycle including selecting from an array of the plurality of memory cells a predetermined number of memory cells constituting a write cell unit, writing data collectively to the predetermined number of memory cells, and verifying the written data, the driver circuit further performing the verify write operation repeatedly until all memory cells within the write cell unit are found to have passed the verification; wherein, with a plurality of the write cell units selected from the array of the plurality of memory cells, the driver circuit performs a plurality of the verify write operations concurrently on the memory cells found to have failed the verification, in such a manner that the writing of data to one write cell unit is started at least one cycle later than the writing of data to another write cell unit.

According to the structure outlined above, the driver circuit controls write verify operations on a plurality of memory cells. More specifically, a predetermined number of memory cells are selected from the plurality of memory cells and taken as a write cell unit. The verify write operation is then performed on the write cell unit in a cycle ranging from writing of data to the write cell unit to verification of the written data, the cycle being repeated until all memory cells in the write cell unit are found to have passed the verification.

In repeatedly carrying out the cycle, the driver circuit controls the start of a first write to the write cell unit as follows: from the above-mentioned plurality of memory cells, those constituting a plurality of the above-mentioned write cell units are selected and subjected concurrently to write verify operations. At this time, the operation-targeted cells are those yet to be verified or those found to have failed the verification. When a plurality of the above-mentioned verify write operations are performed concurrently, the start of writing data to one write cell unit is delayed by at least one cycle relative to the start of writing data to another write cell unit.

When data is written concurrently to a plurality of write cell units, the start of writing data to a second or a subsequent write cell unit is delayed by at least one cycle relative to the start of writing data to the preceding write cell unit. Thus the preceding write cell unit on which the verify write operation has elapsed by at least one cycle turns out to have operation-targeted cells that are fewer than the initially contained memory cells.

It is assumed here that the number of memory cells in each of the write cell units is the same. It is also assumed that only those memory cells not found to have passed the verification are targeted for the verify write operation.

If the above-described shift of the write start point were not carried out, the first write would be performed at the same time on all write cell units. All memory cells verified at least once would obviously be excluded. Thus all memory cells are targeted for the operation. This desires furnishing the write current commensurate with the number of the operation-targeted memory cells. Whereas the write current varies somewhat depending on the write data being "1" or "0," statistically a very large write current is consumed at the first write. As the ordinal number of writes is incremented, the number of the memory cells having passed the verification rises. It follows that statistically the mean value of the consumed write current drops gradually.

According to the embodiments of the present invention, by contrast, it is high probable statistically that one write cell unit consumes the largest current in the first cycle. However, since only one write cell unit is involved, the overall current value does not amount to much.

In the next (i.e., second) cycle, the write cell unit that will probably consume the largest current is shifted to the newly added second write cell unit. In the second cycle, this current plus a second write current applied to the first write cell unit constitutes a total current. That is, in the second cycle, the write current for those cells in the first write cell unit which failed the verification in the first cycle is supplemented by the write current for the second write cell unit to make up the total current. Although the total current in the second cycle is most probably larger than that in the first cycle, the second total current is sure to be less than double the first total current.

The number of write cell units is simply incremented by 1 in each of the third and subsequent cycles. The current value for the remaining old write cell units drops the larger the ordinal number of cycles becomes.

If the embodiments of the present invention are not applied, the total current amount in the first cycle is the largest. As the ordinal number of cycles increases, the total current amount drops in a relatively precipitous manner. By contrast, application of the embodiments of the present invention makes it highly probable to lower the peak of the total current amount and to average the total currents from one cycle to another.

According to another embodiment of the present invention, there is provided a method for performing a verify write operation on a nonvolatile semiconductor memory device, the method including the step of performing the verify write operation in a cycle including selecting from an array of a plurality of memory cells a predetermined number of memory cells constituting a write cell unit, writing data collectively to the predetermined number of memory cells, and verifying the written data, the verify write operation being further performed repeatedly until all memory cells within the write cell unit are found to have passed the verification; wherein, with a plurality of the write cell units selected from the array of the plurality of memory cells, a plurality of the verify write operations are performed concurrently on the memory cells found to have failed the verification, in such a manner that the writing of data to one write cell unit is started at least one cycle later than the writing of data to another write cell unit.

As outlined above, the embodiments of the present invention provide a nonvolatile semiconductor memory device capable of increasing throughput while reducing the total amount of write currents, and a method for performing a verify write operation on that memory device.

DETAILED DESCRIPTION OF THE PREFERRED EMBODIMENTS

Preferred embodiments of the present invention will now be described in reference to the accompanying drawings. The description of how the invention is typically embodied will be made under the following headings:
1. First embodiment: shift of the write start point from one cycle to another
2. Second embodiment: (shift from one cycle to another)+ (varied number of added memory cells)
3. Variations

1. First Embodiment

[Overall Structure]

Figure 1:
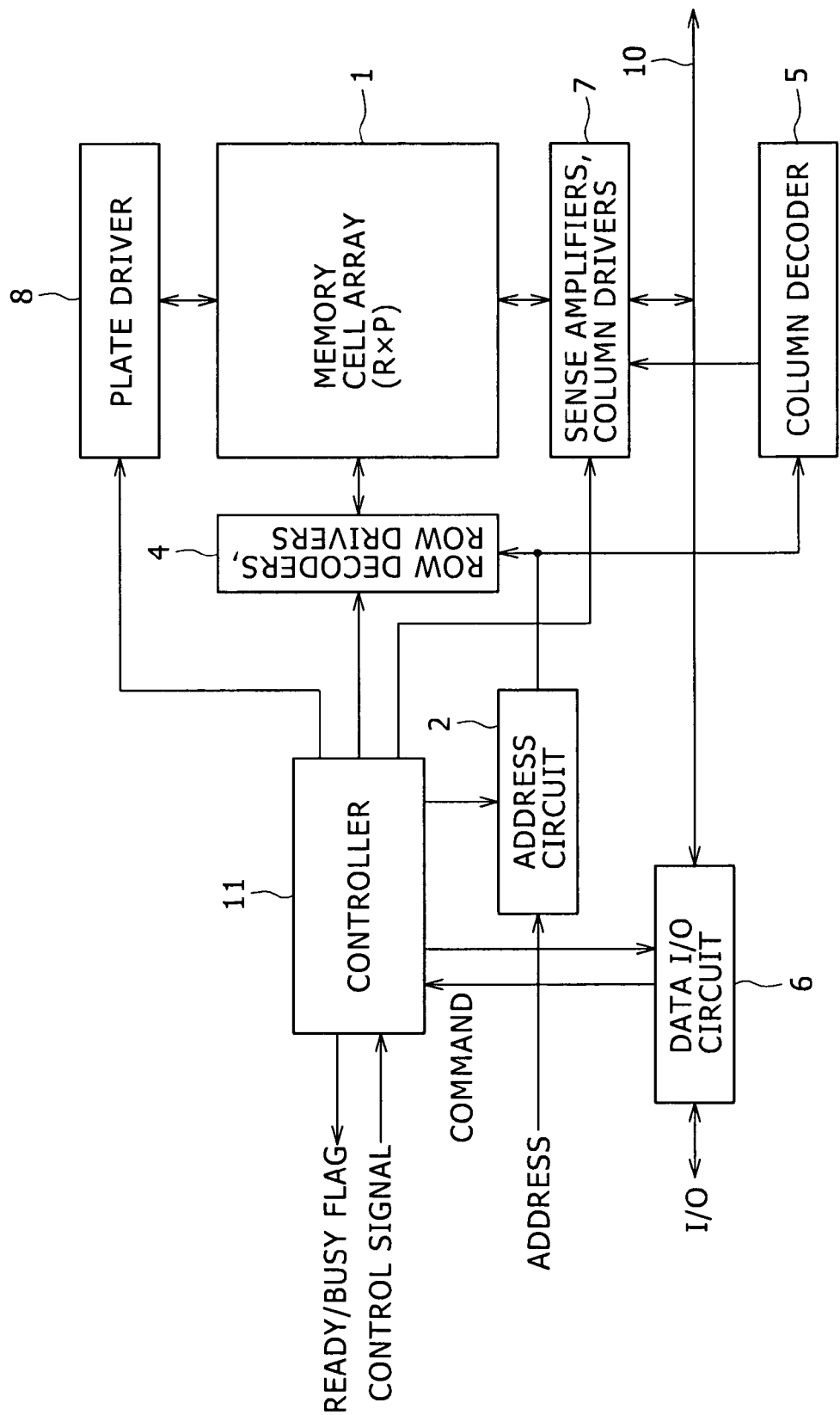
FIG. 1 is a block diagram of a nonvolatile semiconductor memory device practiced as a first and a second embodiment of the present invention.
Figure 2:
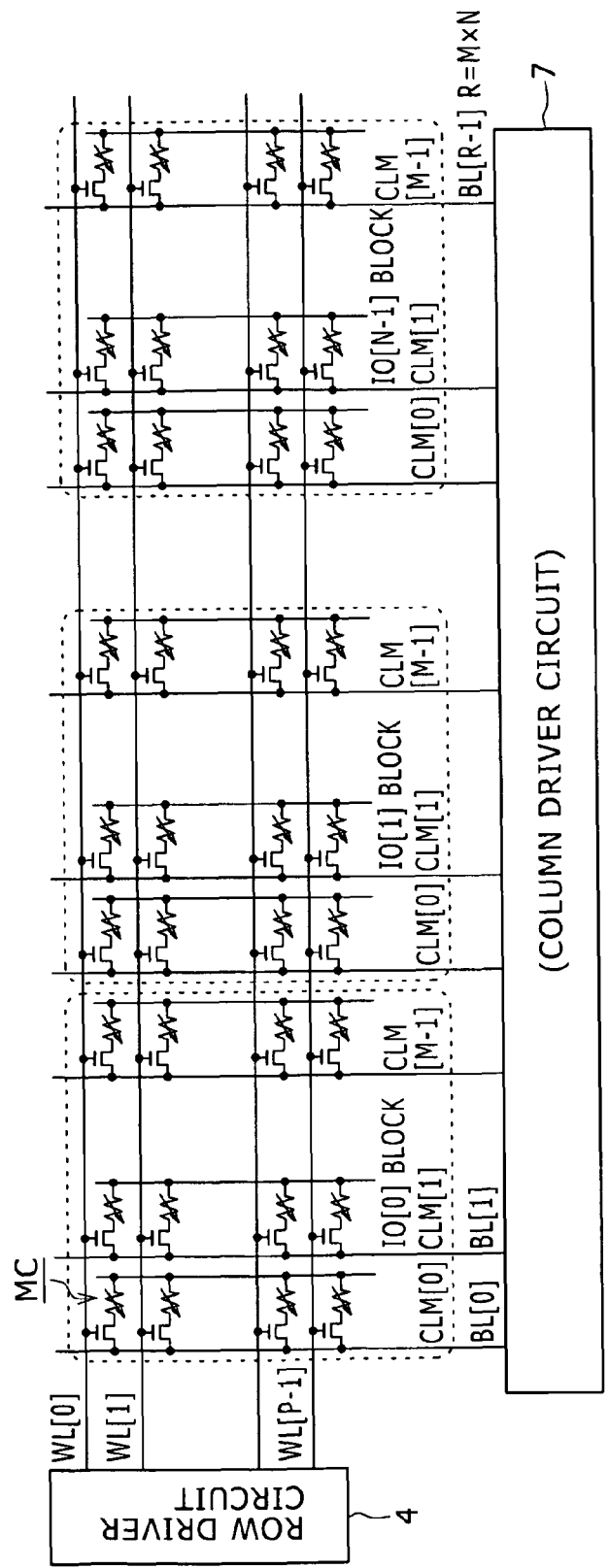
FIG. 2 is a configuration diagram of a memory cell array related to the first and the second embodiments.

FIG. 1 is a block diagram of a nonvolatile semiconductor memory device. FIG. 2 is a configuration diagram of a memory cell array. As shown in FIG. 2, the nonvolatile semiconductor memory device illustrated in FIG. 1 has a memory cell array 1 in which as many as R memory cells and P memory cells are arrayed in the row direction and in the column direction, respectively, in matrix fashion. Here, "R" and "P" each represent a relatively large natural number which may be determined as desired.

As shown in FIG. 1, so-called peripheral circuits are located around the memory cell array 1. The aggregate of all peripheral circuits shown in FIG. 1 (i.e., blocks other than the memory cell array 1) amounts to a typical driver circuit of this invention.

As part of the peripheral circuits for the memory cell array 1, a plate driver 8 and circuit blocks 4 and 7 are connected. The circuit block 4 includes row decoders and row drivers, so that this block will be referred to as the row driver circuit 4 in the ensuing description. The circuit block 7 includes sense amplifiers and column drivers (i.e., drivers for write and read operations), so that this block will be called the column driver circuit 7 hereunder.

Although FIG. 1 shows only one memory cell array 1, one plate driver 8, one row driver circuit 4, and one column driver circuit 7, usually a plurality of units of each of these components are provided. One memory cell array 1, one plate driver 8, one row driver circuit 4, and one column driver circuit 7 are grouped into a sub-array. At least one sub-array constitutes the nonvolatile semiconductor memory device shown in FIG. 1. It should be noted here that the plate driver 8, row driver circuit 4, and column driver circuit 7 may belong to each sub-array (i.e., not shared by any other sub-array) or may be shared by a plurality of adjacent sub-arrays.

FIG. 2 shows how the row driver circuit 4 and column driver circuit 7 are connected to one sub-array in the memory cell array 1. In the memory cell array 1, as shown in FIG. 2, memory cells MC are arranged in matrix fashion; the memory cells MC are interconnected by word lines WL in the row direction and by bit lines BL in the column direction; and the word lines WL and the bit lines BL are connected to the row driver circuit 4 and the column driver circuit 7, respectively.

As will be discussed later in more detail, each memory cell MC is a variable resistance type memory cell made up of one transistor and one variable resistor (memory element). It should be noted that this type of memory cell is a preferred example and that the embodiments of the present invention may be applied to other types of nonvolatile memory cells as well.

FIG. 2 doubles as a schematic view explanatory of how to select a write cell unit constituted by a predetermined number of memory cells MC, to be discussed later. For that reason, FIG. 2 divides the memory cell array 1 into blocks in the row direction. This division of the array into blocks is merely virtual (i.e., not physical); it simply represents different addresses of the memory cells for the column driver circuit 7. Thus the memory cell array 1 may be divided alternatively in ways different from the one illustrated in FIG. 2 (i.e., in terms of the block size and the number of blocks) depending on the addresses to be input to the column driver circuit 7.

More specifically in FIG. 2, there exist as many as R memory cells in the row direction, and these memory cells are divided into N blocks IO[n(=0, 1, . . . , N−1)]. In this case, there is no block division in the column direction. Each of the blocks is made up of as many as M×P memory cells MC.

In FIG. 2 showing N blocks IO[n], the set of memory cells in the first column commonly connected to the first bit line BL is called the first column CLM[0]; the set of memory cells in the second column is called the second column CLM[1]; and so on. Thus the set of memory cells in the last column is called the M-th column CLM[M−1].

For this embodiment, the write cell unit is defined as a set of N physically discrete memory cells selected one by one from the N blocks IO[n] shown in FIG. 2. This write cell unit (or N data items corresponding to the write cell unit) will be referred to as a word in the ensuing description. Whereas each memory cell of a multivalued memory is capable of accommodating data of two bits or more, this embodiment assumes the use of a binary memory, so that N bits corresponding to each write cell unit may also be called a word.

The first word is a set of N memory cells which, out of the R memory cells connected to one word line WL, belong to the first column CLM[0]; the second word is a set of N memory cells which, out of the R memory cells connected to one word line WL, belong to the second column CLM[1]; and so on. Thus the M-th word is a set of N memory cells which, out of the R memory cells connected to one word line WL, belong to the M-th column CLM[M−1].

As described, the R memory cells connected to one word line WL are made up of M words. The M words are also called a page. Depending on the sense amplifier configuration, the M words may constitute either one page or two pages.

The other peripheral circuits shown in FIG. 1 include circuits for controlling the circuits (row driver circuit 4, column driver circuit 7 and plate driver 8) that directly drive the memory cell array 1. These control circuits include an address circuit 2, a column decoder 5, a data input/output (I/O) circuit 6, and a controller 11. The power supply circuit and the circuits for generating and controlling clock signals are not shown.

The address circuit 2 functions as a so-called predecoder and separates an input address signal ("Address") into an X address of higher or lower order bits to be input to the row driver circuit 4 and a Y address of the remaining bits to be input to the column decoder 5. The address circuit 2 may also double as an address register which, under control of the controller 11, holds the address signal for later output in a suitably timed manner.

The row driver circuit 4 operates under control of the address circuit 2 and controller 11, handling signals coming from these components. The row driver circuit 4 admits the X address generated by the address circuit 2 through extraction from the externally input address signal, selects one word line WL designated by the input X address, and drives the selected word line WL with a predetermined voltage for a predetermined time period.

The voltage is applied to the word line WL in order to make the memory cells MC connected to the word line WL ready for a write or a read operation. This voltage is called a word line voltage, a gate voltage, or a write voltage and becomes active when brought High ("H") in the case of this embodiment. The row driver circuit 4 is a circuit that controls the timing for applying pulses (write pulses) each having a peak value as the write voltage, the duration of the pulse, and the voltage being applied. The cell driving power of the write pulses may remain the same for all write operations or may vary depending on the memory cell type. It should be noted that the suitable method for controlling the cell driving power varies with the memory cell type. Illustratively, where the memory cells are of variable resistance type as with this embodiment, the cell driving power of the write pulses may be varied using one or a combination of several methods, including the method for controlling the applied voltage, the method for controlling the number of pulses while keeping the duration of each pulse constant, and the method for controlling the pulse duration.

The column driver circuit 7 contains column drivers such as write drivers and read drivers. The column driver circuit 7 also contains sense amplifiers that read the potential of the bit lines BL (i.e., amplifying the potential to a binary voltage). The column driver circuit 7 is connected to an internal data bus 10.

The column decoder 5 is a circuit which, based on the Y address input from the address circuit 2, activates the sense amplifiers or the column drivers corresponding to specific memory cells.

In the setup of FIG. 2 in which memory cells are divided into blocks, at least one sense amplifier is provided for each block IO[n]. There may be provided as many sense amplifiers as the number of columns in the memory cell array. It should be noted, however, that concentrated mounting of the sense amplifiers results in an greater circuit size. Thus it is preferable to provide a sense amplifier for each block of M memory cells and to have internal switches of the column driver circuit 7 control the way of connecting the sense amplifier to a specific column within that block.

There may also be provided as many column drivers (write drivers and read drivers) as the number of columns. Alternatively, for the above-described reason, as many column drivers as the number of blocks may be provided. In this case, the switches for controlling the connection of the column driver to the bit lines BL are included in the column driver circuit 7.

Also included in the column driver circuit 7 are the column switches for disconnecting the bit lines BL from the loads of such peripheral circuits as the column driver circuit 7 and column decoder 5 in order to facilitate the driving of the bit lines. The column switches and the switches for controlling the connection between the column drivers and the bit lines BL are driven either by switch control signals generated internally by the column driver circuit 7 based on the Y address coming from the column decoder 5, or by control signals sent from the controller 11.

The controller 11 admits various operation control signals such as a write signal, a delete signal and a read signal, and controls the component blocks of the other peripheral circuits based on these input control signals. The controller 11 also has the function of sending out of the chip a status flag (Ready/Busy flag) indicating that the chip (i.e., nonvolatile semiconductor memory device) is either ready for a read/write operation or in a busy state.

The plate driver 8 is a voltage driver controlled by the controller 11. As will be discussed later in more detail, the plate driver 8 controls the plate voltage for letting cell currents flow through variable resistance type memory cells. The plate voltage determines the direction of the memory cell current based on the voltage difference with regard to the voltage of bit lines BL. In order to implement this feature, the plate driver 8 controls inversing of the relationship of difference in intensity of the plate voltage with regard to the bit line voltage between a write and a delete operation. The control is exercised on the basis of a control signal from the controller 11 designating either the write or the delete operation.

[Memory Cell Structure]

Figure 3:
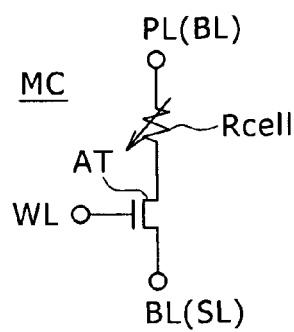
FIG. 3 is an equivalent circuit diagram of a memory cell related to the first and the second embodiments.

FIG. 3 is an equivalent circuit diagram of a memory cell common to the embodiments of the present invention. The memory cell MC illustrated in FIG. 3 is made up of one variable cell resistor Rcell serving as a memory element and one access transistor. One end of the variable cell resistor Rcell is connected to the plate line PL and the other end is connected to the source of the access transistor AT. The drain of the access transistor AT is connected to the bit line BL and the gate of the transistor is connected to the word line WL acting as an access line.

The plate line PL may be arranged in parallel with the bit line BL as shown in FIG. 2, or may be in perpendicular to the bit line BL. Since the plate lines PL are driven at a given point in time with the same voltage within the memory cell array 1, the plate lines may be replaced by a conductive plate if possible. The plate lines PL (or plate) are controlled by the controller 11 and plate driver 8.

The access transistor AT is formed on the semiconductor substrate and has two impurity regions constituting a source and a drain. Between the two impurity regions on the semiconductor substrate, a gate electrode typically made of polysilicon is formed together with a gate insulation film being interposed. The gate electrode either constitutes a word line or is connected to a separately furnished word line. One of the impurity regions is connected to the bit line made of an upper wiring layer. The other impurity region is connected to the variable cell resistor Rcell in the upper layer.

The variable cell resistor Rcell has a film structure having an insulator film and a conductor film interposed between the lower electrode and the upper electrode constituting the plate line PL. The material for the insulator film may be such insulators as SiN, SiO$_2$, or Gd$_2$O$_3$. The material for the conductor film may illustratively be a metallic film containing at least one of the metallic elements Cu, Ag and Al; an alloy film (e.g., CuTe alloy film); or a metallic compound film. Metallic elements other than Cu, Ag or Al may be used instead if they can be readily ionized. The conductor film is formed as a layer for supplying conductive ions.

Illustratively, when the plate line PL side is raised at least to a certain voltage from the bit line BL in the variable cell resistor Rcell upon write operation, Cu, Ag and Al contained in the conductor film are ionized and given the characteristic to be drawn to the cathode side. These metallic conductive ions are injected into the insulator film. This causes the insulating strength of the insulator film to drop, giving the film a degree of conductivity.

Conversely, when the bit line BL voltage is raised from the plate line PL, the conductive ions being injected in the insulator film are brought back to the conductor film. This resets the resistor to the high-resistance state in effect before the write operation. This operation is called a delete (operation).

Figure 4:
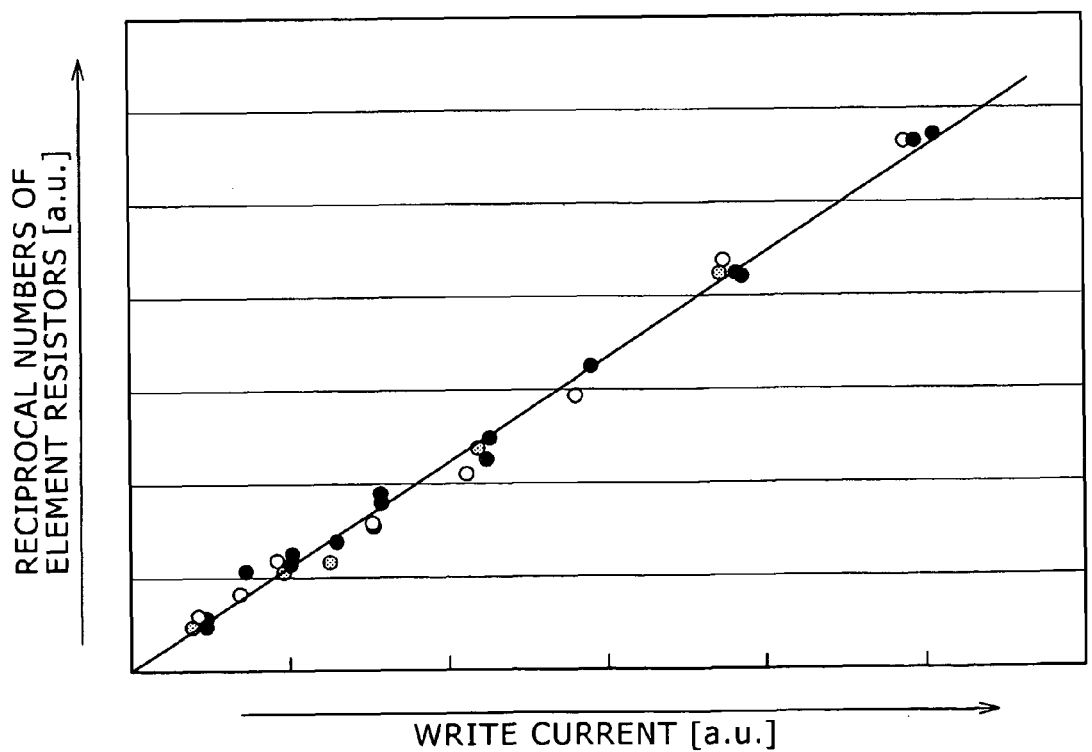
FIG. 4 is a write characteristic diagram of memory cells indicating the relationship between write currents and the reciprocal numbers (conductance) of an element resistor.

FIG. 4 shows the relationship between write currents and the reciprocal numbers (conductance) of an element resistor. From FIG. 4, it can be seen that the resistance value of the variable cell resistor Rcell is approximately in inverse proportion to the write current. In FIG. 4, dots indicate measurements. The discrete dots result from varying in steps the gate voltage value of the access transistor AT being measured. That is, the graph shows that the resistance value of the variable cell resistor Rcell can be controlled with very high precision illustratively by use of the intensity of the gate voltage (write voltage) on the access transistor AT.

The difference between the write and the delete operation, apart from the detail of whether memory cells are addressed individually or collectively in response to input data, is the difference in definition. For example, although the act of sufficiently injecting conductive ions into the insulator is generally called a "write" operation, this may be defined as a delete operation instead. Conversely, although the act of bringing conductive ions from the insulator back to the ion supply layer is generally called a "delete" operation, this may be defined as a write operation. The same can be said of the FG and MONOS types.

In connection with this embodiment of the invention, the act of injecting conductive ions into the insulator to reduce its resistance value is defined as a write operation, and the act of extracting conductive ions from the insulator is defined as a delete operation. However, this is not limitative of the embodiments of the present invention, and the invention may also apply even if the definitions of the write and delete operations are reversed. The same can be said of the FG and MONOS types as well.

Repeating a write and a delete operation on a given memory cell MC implements a binary memory in which the resistance value of the variable cell resistor Rcell in question is reversibly changed between a high-resistance state and a low-resistance state. Furthermore, the written data is retained even after application of the voltage to the cell is stopped, so that the memory cells function as a nonvolatile memory. What follows is a description of drive control on the write operation.

[Verify Write Control]

FIGS. 5A, 5B and 5C are conceptual views of verify write control related to the first embodiment. FIG. 5A schematically shows the elapse of time in performing the procedure for writing data of one word (one write cell unit) designated by a given address k. Likewise, FIG. 5B schematically shows the elapse of time in carrying out the procedure for writing data of one word designated by another address j different from address k (preferably the corresponding memory cells should not overlap). FIG. 5C schematically shows the elapse of time in executing the procedure for writing data to address i which is different from both address k and address j (preferably the corresponding memory cells should not overlap). It should be noted here that address k, address j and address i indicated in FIGS. 5A through 5C may or may not correspond to the same row.

That the three addresses above need not correspond to the same row signifies that they may be connected either to the same word line or to different word lines. Generally, however, the word lines are driven one after another typically for the reason that driving the word lines one at a time is advantageous in suppressing the power being discharged from the word lines. For the ensuring description, it is assumed that the word lines are driven one after another and that the three addresses are sequenced in a manner defining a memory space, e.g., they are contiguous addresses in the sequence of address signals. In this case, each column needs to be furnished with a sense amplifier.

The number of a plurality of words targeted for concurrent verify write operations is not limited to three. However, on the assumption that memory cells do not overlap with one another, the physically same memory cell will not be selected twice or more for a plurality of words subject to concurrent verify write operations.

Figure 6:
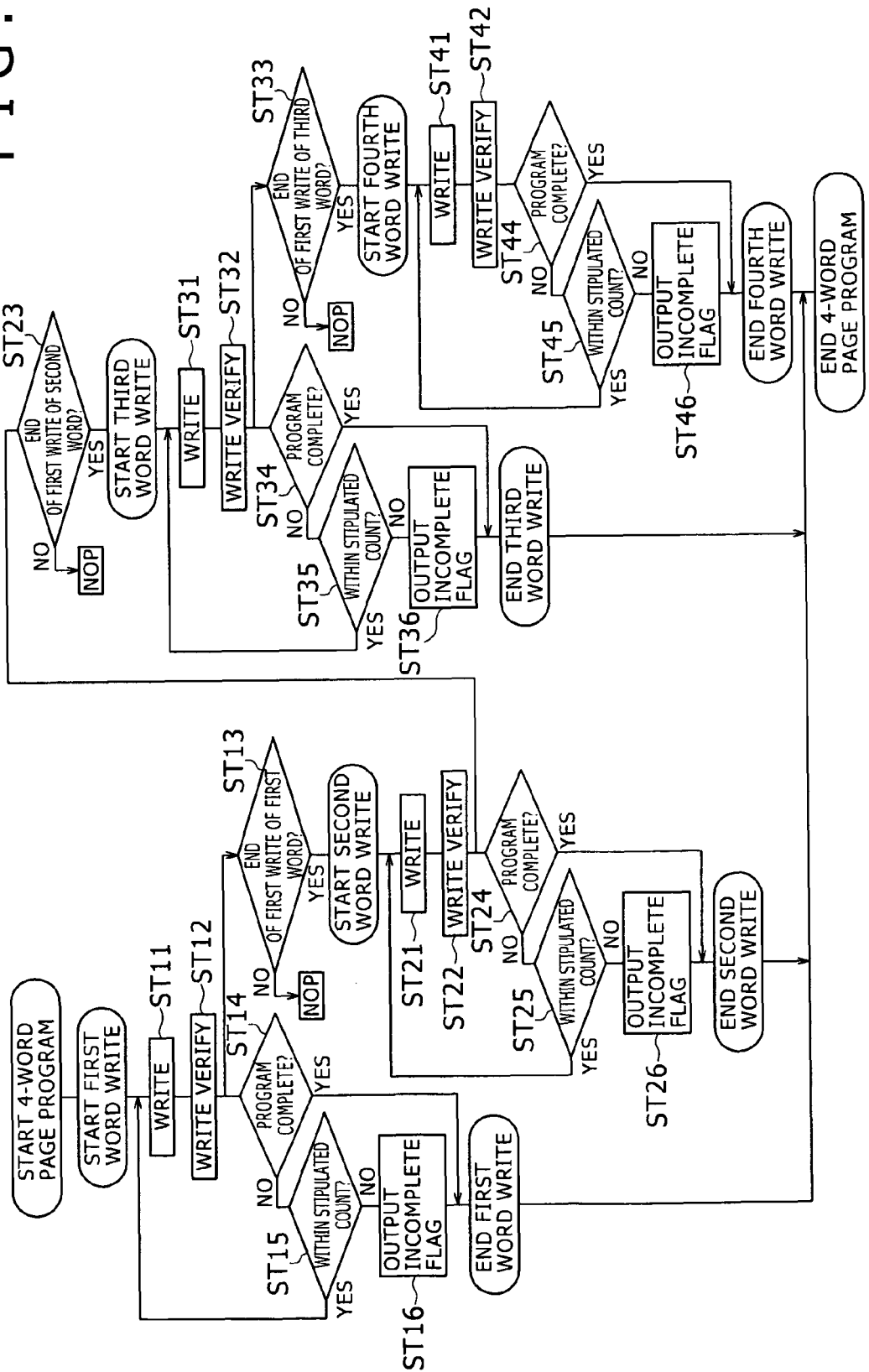
FIG. 6 is an operation flowchart of verify write control related to the first embodiment.
Figure 7:
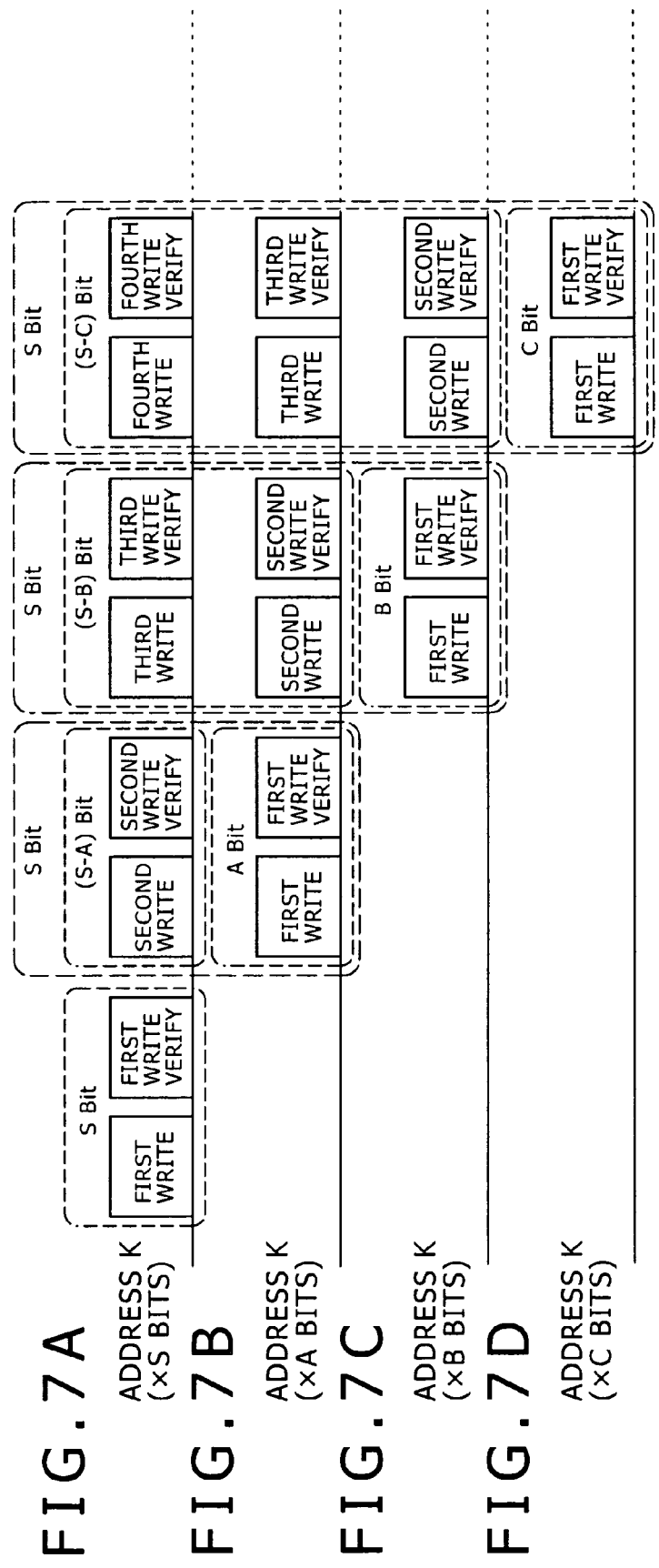
FIGS. 7A, 7B, 7C and 7D are conceptual views of verify write control related to the second embodiment.

FIG. 6 shows an operation flowchart of a procedure for writing four words, starting from the beginning of the write operation. What is explained in FIG. 6 is merely a programming procedure; the peripheral circuits are not desired adaptively to change the procedure by making decisions on the number of times a given step is carried out or whether a given step has come to an end. Specifically, a peripheral circuit operating in keeping with a sequence of which the execution count has been preset may be regarded as an example of the flow of execution shown in FIG. 6. For example, a given step whose execution count has been preset and whose end is to be determined thereby may be terminated in practice without going through such determination when the scheduled write has ended, whereby control is automatically transferred to the next step.

First of all, a first word is written in step ST11. A write verify operation (i.e., readout and verification) is carried out in the next step ST12. The verification is accomplished illustratively by the column driver circuit 7 automatically checking the written data against the readout data and setting a write inhibit upon a match between the two data.

After step ST12, steps ST13 and ST14 are carried out in parallel. In step ST13, a check is made to determine whether a first write of the first word has ended. This step is provided in order to start writing a second word the moment the first write is terminated. That is, the number of cycles for shift is stipulated here. If the shift is to be made in two cycles, the check to be made in step ST13 is about whether a second write of the first word has ended. In this example, the result of the check in step ST13 is affirmative, so that the writing of the second word is started.

Meanwhile, a check is made in step ST14 to determine whether the program is complete. The program is determined to be complete when all bits (memory cells) have been verified. Thus it is highly probable that the result of the check in step ST14 is negative for the first time around. Then step ST15 is reached.

In step ST15, a check is made to determine whether a stipulated write count is exhausted. Without this step (i.e., step ST15) of checking whether the stipulated count is exhausted or not, there will be no exit from the loop ranging from step ST14 to step ST11 in case of a defective memory cell being detected. Step ST15 is provided here to circumvent such an eventuality. If the stipulated write count is found exhausted, then step ST16 is reached, a write incomplete flag is set, and the writing of the first word is terminated.

Figure 5:
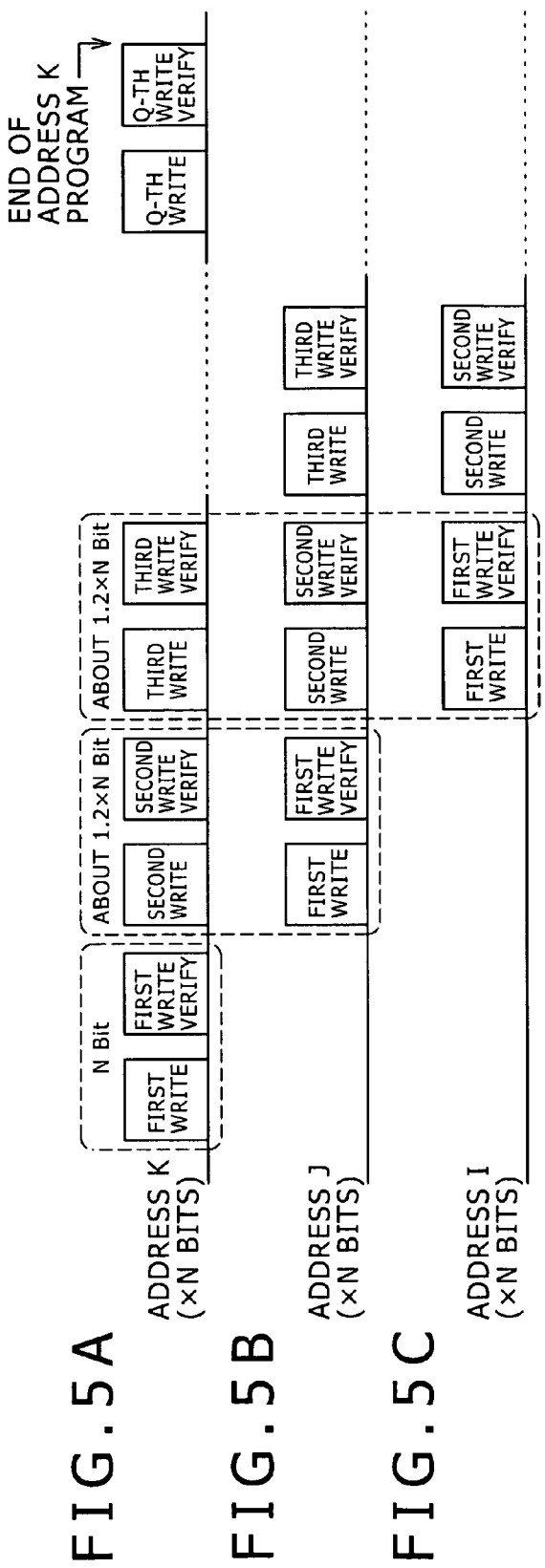
FIGS. 5A, 5B and 5C are conceptual views of verify write control related to the first embodiment.

While the cycle of the second and subsequent write and verify operations on the first word is being carried out, the writing of the second word is started in a synchronously shifted manner as shown in FIG. 5. The steps involved here (i.e., steps ST21 through ST26) are the same as steps ST11 through ST16 performed on the first word.

As in the earlier cycle, the end of the first write in step ST22 is detected in step ST23 and the writing of a third word (in steps ST31 through ST36) is started. In like manner, the writing of a fourth word (in steps ST41 through ST46) is started one cycle later than the start of the third word.

If the fourth word is the last word, then there will be no process (equivalent to steps ST13, ST23 and ST33) for letting the subsequent operation continue upon detection of the end of the first write from step ST42 on as indicated. The end of step ST46 makes the four-word page program complete.

In the subsequent operation flow, if the result of the check in any of steps ST13, ST23, ST33 and ST34 is negative ("No"), the subsequent process (steps ST21 through ST26 in the case of step ST13) will not be carried out. The absence of such processing is indicated as "NOP" in FIG. 6.

In each of steps ST14, ST24, ST34 and ST44 in which a check is made to determine whether the writing (program) is complete, the gate voltage value to be controlled next may be determined on the basis of the result of the preceding write verify operation. This is related to the fact that the resistance-variable type memory cells in which current is strongly correlated to resistance change as shown in FIG. 4 can be controlled in resistance using gate voltage. If the memory cells have the characteristic shown in FIG. 4, the rate of successful writes on them can be controlled by suitably selecting the setting of gate voltage with regard to a stipulated resistance value. For this reason, even with stochastic changes in input data taken into consideration, a highly-probable prediction can be made of how many write operations will complete the writing of data to fault-free memory cells. Thus if the gate voltage value to be controlled next is determined on the basis of the result of the write verify operation, the feature above permits more rapid programming than if the gate voltage value is controlled to be changed one step at a time.

In the first embodiment described above, the program of address j is started one cycle (or several cycles) later than the program of address k before the latter program comes to an end. If as many as Q verify cycles are assumed to be carried out on average before the end of the program, program throughput is multiplied approximately Q-fold.

According to the first embodiment, if the rate of successful programming with a single write is set high (e.g., to 80 percent or higher), then the rise in the peak of the consumed current can be kept to 1.2 times the normal or less and a plurality of addresses can be programmed in parallel.

2. Second Embodiment

FIGS. 7A, 7B, 7C and 7D are conceptual views of verify write control related to the second embodiment. Although it is possible, as in the case of FIGS. 5A through 5C, to constitute a write cell unit by selecting one memory cell per block IO[n] shown in FIG. 2, what is shown in FIGS. 7A through 7D is an example of another kind. That is, a group of as many as S memory cells connected to a given word line WL is taken as one write cell unit. This variation can also be derived from the first embodiment described above. This is a contingent and not essential difference of the second embodiment from the first embodiment.

The real difference of the technique shown in FIGS. 7A through 7D from the technique in FIGS. 5A through 5C is that the number of bits (i.e., memory cell count) added anew to the verify write operation varies from one cycle to another. More specifically, as many as A bits newly added in the second cycle are fewer than the initial S bits. Likewise, B bits added anew in the third cycle are fewer than the S bits and C bits added anew in the fourth cycle are fewer than the S bits. The values A, B and C are not fixed; they vary from one cycle to another. The number of bits to be processed concurrently in each cycle is kept under the number S (bits).

The above kind of control is made possible on the basis of the fact that the probability of passes in verifications (i.e., rate of successful programming) is kept substantially constant given the highly controllable memory cells such as those shown in FIG. 4.

Figure 8:
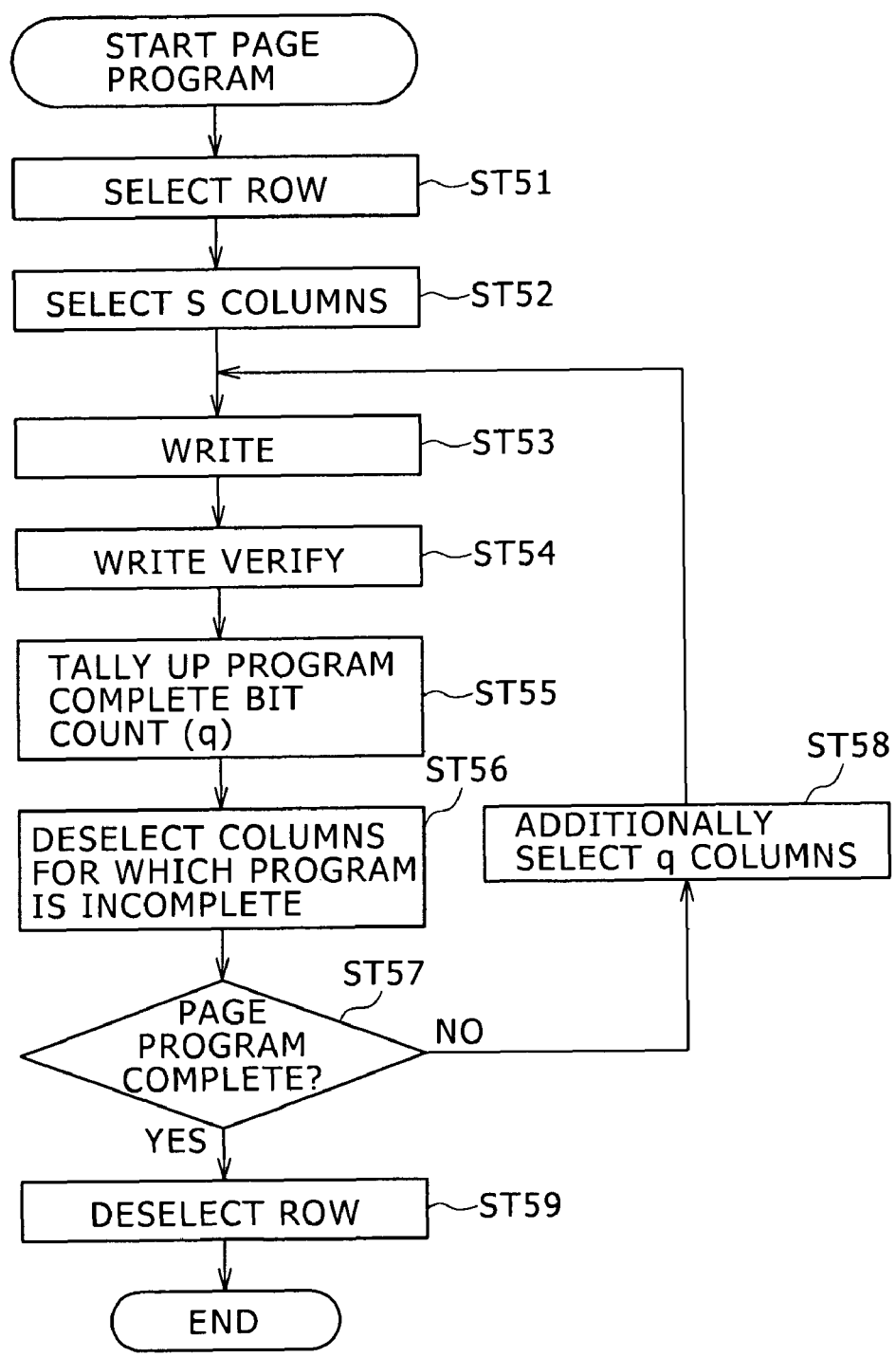
FIG. 8 is an operation flowchart of verify write control related to the second embodiment.

FIG. 8 shows an operation flow related to the second embodiment. Initially, in step ST51, a given word line is activated to select the row. Then from R memory cells connected to the selected word line, a write cell unit connected to a given group of S bit lines (i.e., S columns) is selected in step ST52.

In steps ST53 and ST54, a write and a write verify (read and verify) operation are carried out on the selected write cell unit (S bits). In step ST55, the number of bits q (q≦S) that were successfully programmed and thus passed the verification is tallied. For example, if the number S is set to be 16 and the rate of successful programming is set to be 75 percent, the bit count q is 12. These 12 columns are unselected in the next step ST56. In step ST57 that follows, a check is made to determine whether the page program is complete. When all R bits have been verified and all columns have been unselected, the program is determined to be complete.

At this point, the result of the check in step ST57 is negative ("No") and step ST58 is reached. In step ST58, as many as q new columns (i.e., equal to the preceding number of successfully programmed bits) are selected from the remaining unselected columns. The preferential sequence in which to select the columns is determined in advance.

Then step ST53 is reached again, and the newly selected q columns are added to (S-q) columns that failed in the preceding programming cycle. In steps ST53 and ST54, a write and a write verify operation are carried out on a total of S column obtained through the additional selection. The number of programmed bits is again tallied in step ST55, the successfully programmed columns are again unselected in step ST56, and a check is again made to determine whether the page program is complete in step ST57.

Where the rate of successful programming is set to be 75 percent, 12 bits are successfully programmed and 4 bits fail in the second cycle. Of the four failed bits, one may have been inherited from the first cycle.

The steps above are repeated in the third and subsequent cycles. In a cycle toward the end of one page, there may no longer be sufficient bits to be added in step ST58. In that case, the write is performed on fewer than S bits. Eventually, when programming of the entire page is found to be complete, the current row is unselected in step ST59, and the write of one page comes to an end.

In the operation flow above, the write is performed on S bits constantly throughout the cycles except for a few cycles toward the end. That means the amount of the consumed write current is kept more uniform by the second embodiment than by the first embodiment. As a result, even if the capacity of the power supply circuit is set low in keeping with the maximum write count S, performance is guaranteed. Hence come two possibilities: either the scale of the power supply circuit may be reduced, or the driving power of the power supply circuit may be raised in order to increase operating speed.

The operations discussed above may be itemized as follows:

(1) With a page program made up of R bits, a write and a verify operation are initially performed on S bits in the first verify cycle, where S is smaller than R.

(2) The second verify cycle is started on the new bits of which the number is smaller than that of those on which the write was complete in the first verify cycle.

(3) The third verify cycle is started on the new bits of which the number is smaller than that of those on which the write was complete in the second verify cycle.

(4) Cycles of the similar nature are repeated.

(5) The itemized steps (1) through (4) above may be generalized into the following expression: the K-th verify cycle is started on the new bits of which the number is smaller than those on which the write was complete in the (K−1)th verify cycle.

With the second embodiment, the number of bits subjected concurrently to each verify cycle is typically kept smaller than S. This makes it possible to maximize programming throughput while limiting the peak consumed current to the write current that is commensurate with S bits.

The second embodiment is suitable for cases where each page is deleted beforehand following collective erasure and is submitted to selective programming (writing) in accordance with write data. In such cases, the bits (columns) not to be programmed (i.e., not to have data written thereto) according to the write data may be inhibited beforehand so that they will not be selected.

3. Variations

The nonvolatile memory cells to which the embodiments of the present invention can be applied are not limited to the resistance-variable type memory cells MC. As described above, the write verify operation of the embodiments of this invention is aimed at suppressing the total cell current. The ability of the embodiments to lower the total cell current is technically corroborated by the fact that the memory cell resistance is highly controllable as illustrated in FIG. 4. In that respect, the present invention is especially effective when applied to the embodiments (especially the second embodiment) of the invention incorporating resistance-variable memory cells.

It should be noted, however, that when it comes to controlling whether or not to let the cell current flow, voltage control type memory cells are sufficiently effective in suppressing the total consumed current. In this regard, the present invention is applicable to all nonvolatile memories including the FG and MONOS types (NAND, OR, etc.), as well as MRAM and ReRAM.

The present application contains subject matter related to that disclosed in Japanese Priority Patent Application JP 2009-024724 filed in the Japan Patent Office on Feb. 5, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A nonvolatile semiconductor memory device comprising:

a plurality of memory cells; and a driver circuit configured to perform a verify write operation in a cycle including selecting from an array of said plurality of memory cells a predetermined number of memory cells constituting a write cell unit, writing data collectively to said predetermined number of memory cells, and verifying the written data, said driver circuit further performing said verify write operation repeatedly until all memory cells within said write cell unit are found to have passed the verification;

wherein, with a plurality of said write cell units selected from the array of said plurality of memory cells, said driver circuit performs a plurality of said verify write operations concurrently on the memory cells found to have failed the verification, in such a manner that the writing of data to one write cell unit is started at least one cycle later than the writing of data to another write cell unit.

2. The nonvolatile semiconductor memory device according to claim 1, wherein, given said plurality of said write cell units, said driver circuit maximizes the number of memory cells in the write cell unit to which to write data first, said driver circuit further varying the number of memory cells in each of the write cell units to which the writing of data is started in a progressively delayed manner.

3. The nonvolatile semiconductor memory device according to claim 2, wherein said driver circuit controls the number of memory cells in each write cell unit in such a manner that the number of memory cells on which said verify write operations are performed concurrently in one cycle does not exceed the maximum number of memory cells in the write cell unit to which data is first written.

4. The nonvolatile semiconductor memory device according to claim 3, wherein said one write cell unit to which the writing of data is started at least one cycle later than said another write cell unit has an address contiguous to the address of said another write cell within the array of said plurality of memory cells.

5. The nonvolatile semiconductor memory device according to claim 4, wherein said plurality of memory cells are each formed in such a manner that a memory element of which the resistance value varies with an applied voltage and an access transistor are serially connected between a first common line and a second common line.

6. The nonvolatile semiconductor memory device according to claim 1, wherein said one write cell unit to which the writing of data is started at least one cycle later than said another write cell unit has an address contiguous to the address of said another write cell within the array of said plurality of memory cells.

7. The nonvolatile semiconductor memory device according to claim 6, wherein said plurality of memory cells are each formed in such a manner that a memory element of which the resistance value varies with an applied voltage and an access transistor are serially connected between a first common line and a second common line.

8. The nonvolatile semiconductor memory device according to claim 1, wherein said memory cells are resistance-variable type memory cells.

9. A method for performing a verify write operation on a nonvolatile semiconductor memory device, said method comprising the step of
performing said verify write operation in a cycle including selecting from an array of a plurality of memory cells a predetermined number of memory cells constituting a write cell unit, writing data collectively to said predetermined number of memory cells, and verifying the written data, said verify write operation being further performed repeatedly until all memory cells within said write cell unit are found to have passed the verification;
wherein, with a plurality of said write cell units selected from the array of said plurality of memory cells, a plurality of said verify write operations are performed concurrently on the memory cells found to have failed the verification, in such a manner that the writing of data to one write cell unit is started at least one cycle later than the writing of data to another write cell unit.

10. The method for performing the verify write operation on the nonvolatile semiconductor memory device according to claim 9, wherein said memory cells are resistance-variable type memory cells.

* * * * *